(12) United States Patent
Welp et al.

(10) Patent No.: US 7,715,892 B2
(45) Date of Patent: May 11, 2010

(54) TUNABLE, SUPERCONDUCTING, SURFACE-EMITTING TERAHERZ SOURCE

(75) Inventors: Ulrich Welp, Lisle, IL (US); Alexei E. Koshelev, Bolingbrook, IL (US); Kenneth E. Gray, Naperville, IL (US); Wai-Kwong Kwok, Evanston, IL (US); Vitalii Vlasko-Vlasov, Downers Grove, IL (US)

(73) Assignee: Uchicago Argonne, LLC, Chicago, IL (US)

( * ) Notice: Subject to any disclaimer, the term of this patent is extended or adjusted under 35 U.S.C. 154(b) by 0 days.

(21) Appl. No.: 12/605,997

(22) Filed: Oct. 26, 2009

(65) Prior Publication Data

US 2010/0041559 A1 Feb. 18, 2010

Related U.S. Application Data

(62) Division of application No. 11/728,615, filed on Mar. 27, 2007, now Pat. No. 7,610,071.

(60) Provisional application No. 60/786,269, filed on Mar. 27, 2006.

(51) Int. Cl.
H01L 39/08 (2006.01)
H01L 39/22 (2006.01)
G01R 33/02 (2006.01)

(52) U.S. Cl. .................. 505/190; 505/193; 324/248; 250/336.2; 343/700 R; 340/870.18

(58) Field of Classification Search ............ 505/190, 505/193; 324/248; 250/336.2; 343/700 R; 340/870.18
See application file for complete search history.

(56) References Cited

U.S. PATENT DOCUMENTS

| 4,157,555 | A | * | 6/1979 | Gray | 257/36 |
| 4,585,999 | A | * | 4/1986 | Hilbert et al. | 330/61 R |
| 4,873,482 | A | * | 10/1989 | Gray | 324/71.4 |
| 4,970,395 | A | * | 11/1990 | Kruse, Jr. | 250/336.2 |
| 5,307,068 | A | * | 4/1994 | Hartemann | 342/1 |
| 5,346,882 | A | * | 9/1994 | Muller | 505/190 |
| 5,538,941 | A | * | 7/1996 | Findikoglu et al. | 505/210 |
| 5,990,766 | A | * | 11/1999 | Zhang et al. | 333/205 |
| 6,097,263 | A | * | 8/2000 | Mueller et al. | 333/17.1 |
| 6,239,431 | B1 | * | 5/2001 | Hilton et al. | 250/336.2 |
| 6,348,699 | B1 | * | 2/2002 | Zehe | 257/32 |
| 6,638,895 | B1 | * | 10/2003 | Karapetrov et al. | 505/320 |
| 7,078,695 | B2 | * | 7/2006 | Luukanen | 250/336.2 |
| 2003/0222217 | A1 | * | 12/2003 | Luukanen | 250/336.2 |
| 2005/0215436 | A1 | * | 9/2005 | Takano et al. | 505/100 |
| 2005/0230822 | A1 | * | 10/2005 | Tran | 257/735 |

OTHER PUBLICATIONS

Tachiki, M., "Emission of terahertz electromagnetic waves driven by an external current in intrinsic Josephson junctions", *Physica C 468*, (2008), pp. 631-633, Elsevier B.V.

Report of the DoE-NSF-NIH Workshop on "Opportunities in THz Science", Feb. 12-14, 2004, http://www.sc.doe.gov/bes/reports/list.html.

Foresight Review on "Exploiting the Electromagnetic Spectrum—Picturing people: non-intrusive imaging", Apr. 2004, http://www.foresight.gov.uk/Previous_Projects/Exploiting_the_electromagnetic_spectrum/index.html.

K. Kawase, "Terahertz Imaging", Optics & Photonics News, Oct. 2004, p. 34.

E. R. Mueller, "Terahertz radiation: applications and sources", The Industrial Physicist, Aug. 2003, p. 27.

M. Tonouchi "Cutting-edge terahertz technology", Nature Photonics, 1, 97 (2007).

P. H. Siegel "Terahertz technology", IEEE Trans. Microwave Theory Tech. 50, 910 (2002).

M. Tinkham "Introduction to Superconductivity" (McGraw-Hill, New York, 1996).

R. Kleiner, F. Steinmeyer, G. Kunkel G. P. Müller, "Intrinsic Josephson effect in $Bi_2Sr_2CaCu_2O_8$ single crystals". Phys. Rev. Lett. 68, 2394 (1992).

T. Koyama, M. Tachiki, "Plasma excitation by vortex flow", Solid State Commun. 96, 367 (1995).

M. Tachiki, M. Iizuka, K. Minami, S. Tejima, H. Nakamura, "Emission of continuous coherent terahertz waves with tunable frequency by intrinsic Josephson junctions", Phys. Rev. B 71, 134515 (2005).

L. N. Bulaevskii, A. E. Koshelev, "Radiation from Flux Flow in Josephson Junction Structures", Journal of Superconductivity and Novel Magnetism 19, 349 (2006).

H. B. Wang et al., Appl. Phys. Lett. 89, 252506 (2006).

K. Kadowaki et al., Physica C 437-438, 111 (2006).

A. Irie, Y. Hirai, G. Oya, Appl. Phys. Lett. 72, 2159 (1998).

V. M. Krasnov, N. Mros, A. Yurgens, D. Winkler, Phys. Rev. B 59, 8463 (1999).

M.-H. Bae, H.-J. Lee, "Vortex-flow electromagnetic emission in stacked intrinsic Josephson junctions", Appl. Phys. Letters 88, 142501 (2006).

M.-H. Bae, H.-J. Lee, J.-H. Choi, "Josephson Vortex-Flow Terahertz Emission in Layered High-Tc Superconducting Single Crystals", Phys. Rev. Letters 98, 027002 (2007).

I. E. Batov, X. Y. Jin, S. V. Shitov, Y. Koval, P. Mueller, A. V. Ustinov, "Detection of 0.5 THz radiation from intrinsic $Bi_2Sr_2CaCu_2O_8$ Josephson junctions", Appl. Phys. Letters 88, 262504 (2006).

A. E. Koshelev, I. Aranson, "Dynamic structure selection and instabilities of driven Josphson lattice in high-temperature superconductors", Phys. Rev. B 64, 174508 (2001).

* cited by examiner

*Primary Examiner*—Douglas Mc Ginty
(74) *Attorney, Agent, or Firm*—Foley & Lardner LLP

(57) ABSTRACT

A compact, solid-state THz source based on the driven Josephson vortex lattice in a highly anisotropic superconductor such as $Bi_2Sr_2CaCu_2O_8$ that allows cw emission at tunable frequency. A second order metallic Bragg grating is used to achieve impedance matching and to induce surface emission of THz-radiation from a $Bi_2Sr_2CaCu_2O_8$ sample. Steering of the emitted THz beam is accomplished by tuning the Josephson vortex spacing around the grating period using a superimposed magnetic control field.

20 Claims, 3 Drawing Sheets

TUNABLE, SUPERCONDUCTING, SURFACE-EMITTING TERAHERZ SOURCE

CROSS REFERENCE TO RELATED PATENT APPLICATIONS

This application is a divisional application and claims priority to U.S. patent application Ser. No. 11/728,615, filed Mar. 27, 2007, now U.S. Pat. No. 7,610,071, which claims priority to U.S. Provisional Patent Application No. 60/786, 269, filed Mar. 27, 2006, incorporated herein by reference in their entirety.

The United States Government has certain rights in this invention pursuant to Contract No. DE-AC02-06CHI1357 between the United States Department of Energy and UChicago Argonne, LLC as operator of Argonne National Laboratories.

BACKGROUND OF THE INVENTION

Terahertz (THz) science deals with the region of the electromagnetic spectrum that is frequently defined as ranging from 0.3 to 20 THz (10-600 $cm^{-1}$, 1 mm-15 μm wavelength). The field of terahertz science is rapidly developing and portends immense promise in fields as diverse as medical diagnostics, space exploration, environmental monitoring, security, manufacturing and pharmaceuticals. This wide range of areas of application derives primarily from two unique properties of THz radiation, 1) its spectral specificity to vibrational and rotational modes of a wide variety of important chemical and biomolecular species, and 2) to its well known penetrating properties through, for example, conventional packaging materials, clothes and plastics. A third property, its wavelength range of 15 μm to 1 mm, also allows for imaging with good spatial resolution.

The development of sources of THz radiation is being pursued along various conventional approaches, including ultra-fast laser pumped photoconductive switches, pumped gas lasers, optical difference frequency generation and parametric oscillation, frequency doubled diodes, quantum cascade lasers. An alternative approach is based on the superconducting Josephson effect that occurs between layers of superconducting materials that are separated by thin insulating non-superconducting materials. When a voltage difference, U, is applied between the superconducting layers, an alternating electro-magnetic wave (referred to as Josephson plasma waves in what follows) arises in the insulating layer whose frequency, ν, is given by $\nu = K_J U$, where $K_J = 4.84 \times 10^{14}$ Hz/V is the Josephson constant. This translates into a voltage of 2 mV for a frequency of 1 THz. The maximum voltage that can be applied to a superconductor without destroying the superconducting state is limited by the size of the superconducting energy gap, which is a material dependent parameter. The $CuO_2$-based high-temperature superconductors display energy gaps of several tens of meV, and the THz-frequency range is accessible with these materials. In particular, highly anisotropic high-temperature superconductors, such as the $Bi_2Sr_2CaCu_2O_8$ derived superconductors, are composed of superconducting $CuO_2$ layers separated by insulating layers, thus forming stacks of intrinsic Josephson junctions. The potential of the Josephson effect in these compounds as an efficient source for THz-radiation has been recognized for some time, and extensive numerical simulations indicated high THz-power. However, so far it has proven very difficult to extract THz-radiation power from high-temperature superconducting sources, the major limitations arising from a) the large mismatch of the wavelengths of the Josephson alternating electro-magnetic field and of free-space THz-radiation, and from b) the typically very small surface areas from which THz emission can occur.

SUMMARY OF THE INVENTION

The present invention relates to methods and apparatus for overcoming the deficiencies in the prior art superconducting THz sources, namely the large impedance mismatch of the Josephson plasma waves and the free-space THz radiation, as well as the low power output arising from the small size of the emitting surfaces. In one embodiment of the present invention a metallic grating is fabricated on top of the stack of Josephson junctions. The function of this grating is twofold: a) It serves as an electrical contact to supply a voltage and current to the superconductor and b) the period of the metallic grating is designed in such a way that Bragg reflection of the Josephson plasma waves occurs, thereby enabling matching of the wavelengths. The THz radiation will thereby be emitted through the slots in the grating realizing the so-called surface-emitting configuration. This configuration, as opposed to the previously envisioned end-fire configuration, significantly enhances the active surface area, and thereby greatly increases the radiated power. Furthermore, a new capability of THz radiation is opened up by the present invention, namely the steering of a coherent THz beam, which could have great impact on THz imaging applications, for example, in stand-off chemical detection.

One aspect of the invention relates to a compact, solid-state THz source based on the driven Josephson vortex lattice in a highly anisotropic superconductor such as $Bi_2Sr_2CaCu_2O_8$ that allows THz emission at a tunable frequency. A second order metallic Bragg grating is used to achieve impedance matching and to induce surface emission of THz-radiation from a $Bi_2Sr_2CaCu_2O_8$ sample. Steering of the emitted THz beam is accomplished by tuning the Josephson vortex spacing around the grating period using a superimposed magnetic control field.

These and other objects, advantages, and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF THE PREFERRED EMBODIMENTS

Figure 2A:
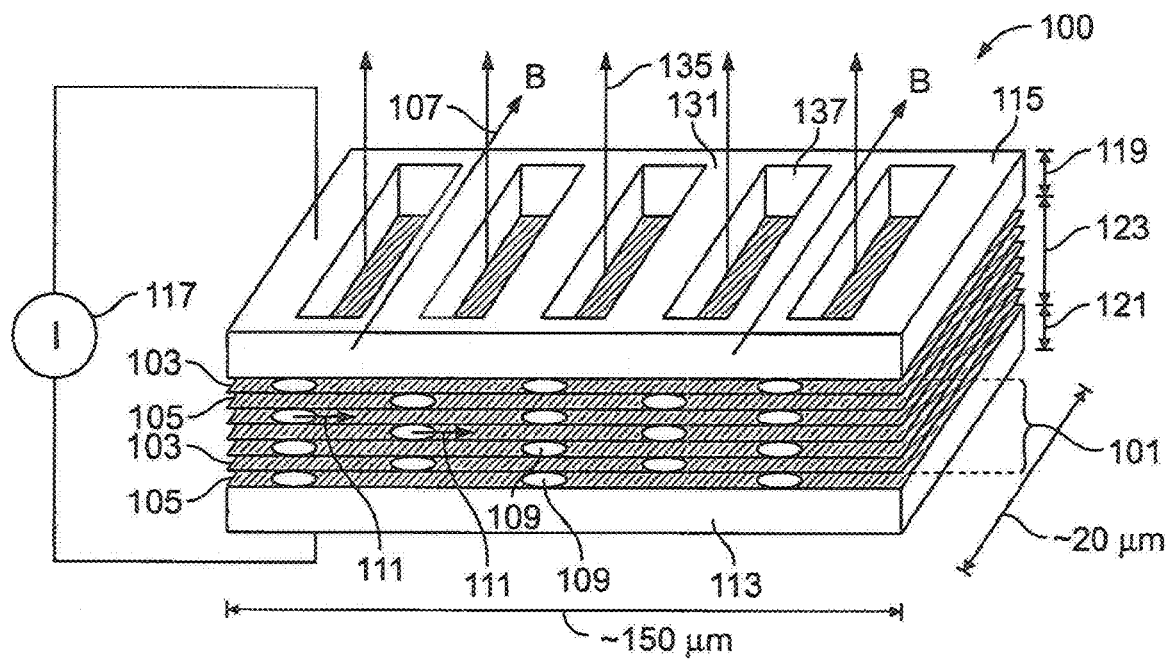
FIG. 2A is an illustration of one form of surface-emitting THz source comprising a $Bi_2Sr_2CaCu_2O_8$ crystal positioned between two Au electrodes.
Figure 2B:
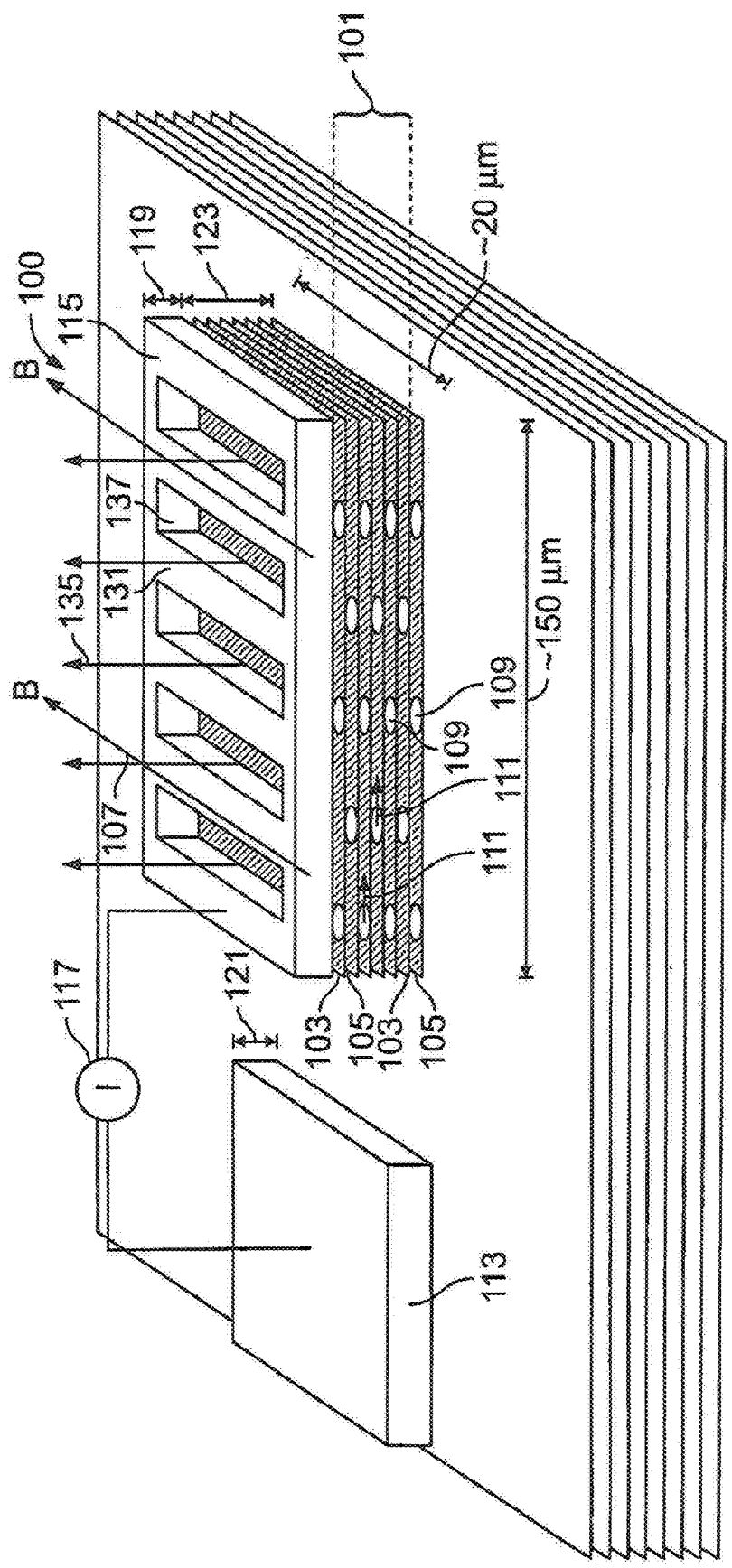
FIG. 2B is another embodiment of a surface-emitting THz source in which the surface of a $Bi_2Sr_2CaCu_2O_8$ crystal is patterned in such a way as to yield a mesa-shaped stack resting on a larger base and a metal grating positioned on top of the mesa.

In accordance with an embodiment of the invention, a THz emitter includes a stack 101 of superconducting layers 103 that are separated by insulating layers 105 (see FIGS. 2A and 2B). In FIG. 2A these layers 103, 105 are disposed between a top metal layer 115 and a bottom metal layer 113, generally gold, a gold alloy or any conventional accepted conductor layer. As shown in FIGS. 2A and 2B, the entire device 100 is quite thin, with the top metal layer 115 having a thickness denoted as 119 and the bottom layer 113 having a thickness denoted as 121. In one preferred embodiments each of the top and bottom layers 115, 121 have a thickness of about 75 nm each. The superconducting stack 101 has a thickness labeled as 123 (see FIG. 2A), and in one preferred embodiment the superconducting stack 101 thickness is less than about 100 nm. The thickness denoted 123 comprises a series of the superconducting layers 103 separated by insulating layer portions 105. In FIG. 2A electrical contact to the superconducting stack 101 is realized through metal layers 119, 121 attached to the top and bottom of stack 101. The top metal layer 119 is patterned into a grating. FIG. 2B illustrates an embodiment of the surface-emitting THz source in which the surface of a wide superconducting stack is patterned in such a way as to yield a mesa-shaped stack resting on the wider base. A metal grating is positioned on top of the mesa; and an electrical current, I, is injected through the metal grating, travels down the mesa and into the base, and is extracted through the counter electrode deposited onto the surface of the base next to the mesa. The functioning of the embodiment is identical to that shown in FIG. 2A. The drawings 2A and 2B are not to scale, the spacing between the superconducting layers and the width and period of the slots in the grating in particular are largely exaggerated for clarity.

Figure 1:
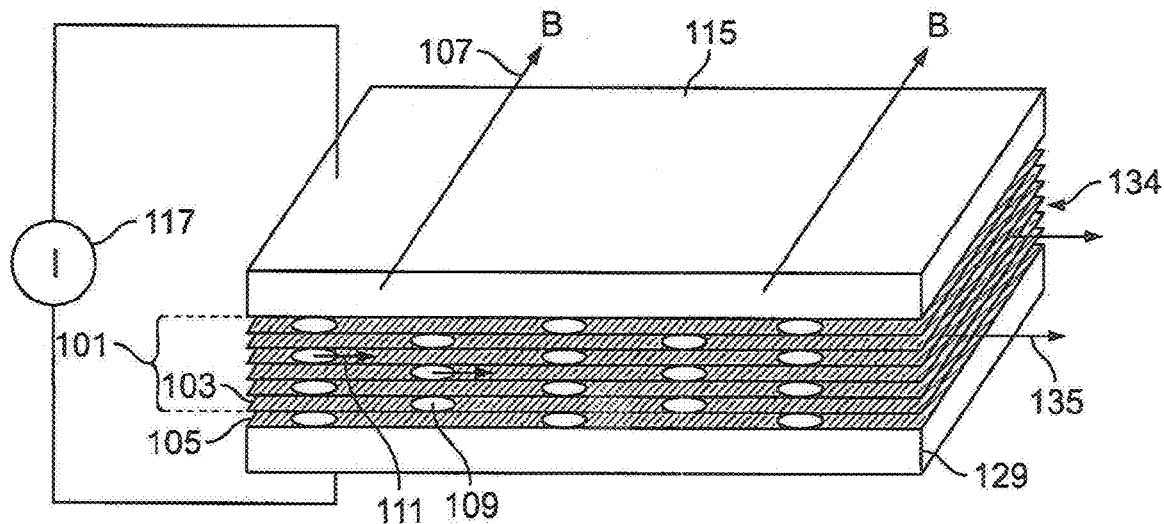
FIG. 1 illustrates a conventional superconducting THz source in end-fire configuration.

In a conventional prior art form of a superconducting THz emitter as shown in FIG. 1, the THz-power 135 would radiate from an end face 134 (an end-fire configuration) of the device 100. The thickness of the superconductor stack 101, is limited to typically less than about 100 nm due to Joule heating in the device 100. Therefore, the active surface area is very small, thereby substantially limiting the net radiated power. Furthermore, there is a very large mismatch between the free-space wavelength, about 300 μm at 1 THz, and the Josephson plasma wavelength, set by the vortex spacing, typically less than 10 μm. As a consequence, the prior art devices are inefficient because the THz waves do not emit from the edge surfaces but instead, are back-reflected into the superconductor.

As described hereinbefore, the device 100 of the present invention is shown schematically in different embodiments in FIGS. 2A and 2B. THz emission is accomplished by any one of a variety of high temperature superconductors as known in the art. Josephson vortices move (in a uniform direction) parallel to the superconductor layers 103 inducing a voltage. This voltage in turn induces an oscillating current due to the well-known Josephson effect. The input energy is stored in the form of a standing Josephson plasma wave with part of the energy coupled into radiation through a metal grating 131 in the top face 115 rather than the side face 134 of the prior art devices (see FIG. 1).

In one preferred embodiment, the source of electromagnetic energy is a single crystal superconductor, $Bi_2Sr_2CaCu_2O_8$, having the layers 103 and 105. The superconducting layers 103 are composed of superconducting $CuO_2$-planes that are coupled to each other across intervening insulating BiO—SrO layer portions 105 through weak Josephson coupling. When subjected to an applied magnetic field, B, denoted by 107 oriented parallel to the planes, the magnetic field lines will penetrate the material in the form of Josephson vortices 109 that squeeze in between the superconducting layers 103. The centers of the Josephson vortices 109 reside in the insulating layer portions 105. A current, I, denoted by 117 flows perpendicular to the planes down the stack of the layers (103) and also the insulating layers 105 and the current flow generates a Lorentz force that drives the Josephson vortices 109 parallel to the planes in a direction denoted as 111. Since they move in a rather un-impeded fashion, they travel as a regular lattice at high velocities (see FIG. 2A). This coherently moving Josephson vortex 109 lattice induces ac electromagnetic waves and currents. Their frequency, ν, is determined by the voltage, U, across the superconductor layers 103 and can, therefore, be tuned by the applied current. A voltage of 2 mV per layer corresponds to 1 THz, and the technologically important terahertz frequency range of 0.1 to 5 THz can easily be scanned. The wavelength, $\bar{\lambda}$, is given by the distance between the Josephson vortices 109, typically several micrometers, and is determined by the applied field. Typical field strengths are several kG, which in an optimized device, can be generated with permanent magnets.

The layered superconducting structure of the device 100, as shown in FIGS. 2A and 2B, exhibits a spectrum of electromagnetic modes, the Josephson plasma waves, that are analogous to the guided modes in a waveguide. If the applied field and current are adjusted in such a way that the velocity of the moving lattice of the Josephson vortices 109 coincides with that of a Josephson plasma mode, resonance occurs; and a large amount of energy is pumped from the moving lattice of the vortices 109 into this plasma wave. It has been estimated that the resulting electro-magnetic power density in the stack 101 at THz-frequencies is very large, about 100 W/cm².

In preferred form of the present device 100, the metal grating 131 is patterned onto the top one of the superconducting stack 101 as shown schematically in FIGS. 2A and 2B. In an exemplary embodiment, the metal grating 131 functions also as an electrical contact. In addition, in one embodiment, the metal grating 131 will induce a strong periodic variation of the dielectric constant at the surface of the superconducting stack 101. Since, in one embodiment, the stack 101 is thinner than both the plasma wavelength and the screening length (typically about 300 nm at 1 THz), this periodic perturbation affects the propagation of the Josephson plasma waves throughout the entire stack 101. As a consequence, the Josephson plasma waves can undergo Bragg reflection, similar to Bragg reflection of x-rays or neutrons from crystals. Bragg reflection allows an elegant way of controlling the propagation of electromagnetic waves.

Figure 3:
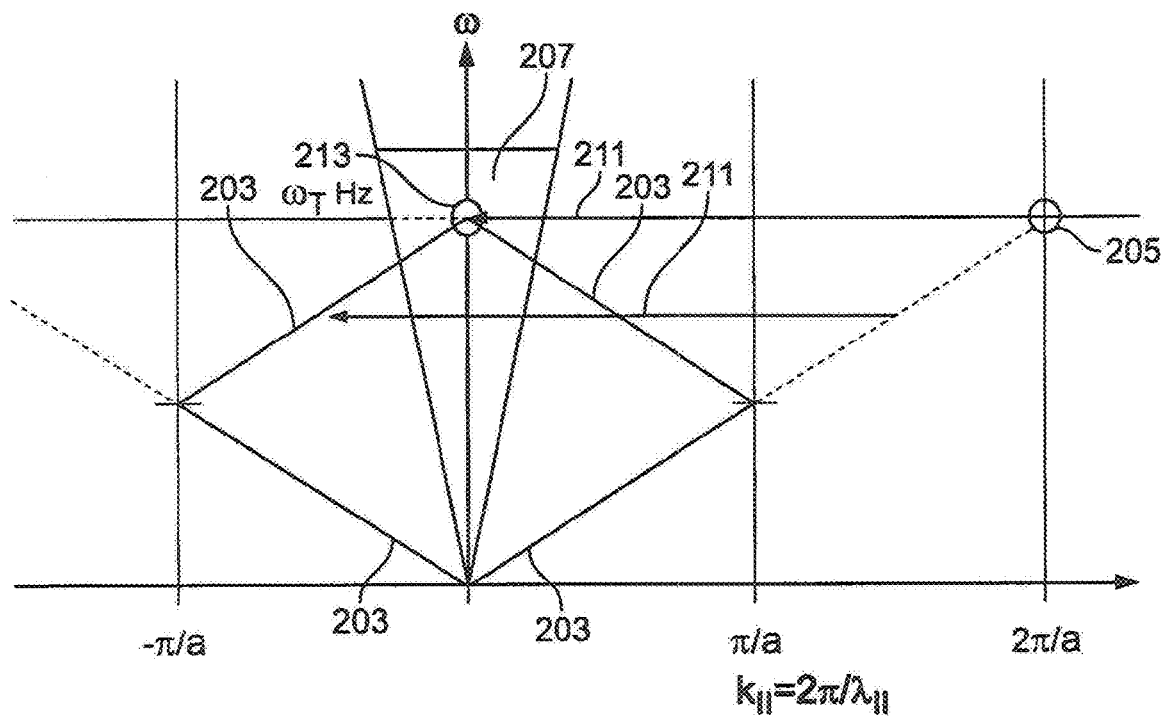
FIG. 3 graphically illustrates the mechanism of converting the non-radiative THz-Josephson plasma waves into THz radiation.

The principle of operation is illustrated in FIG. 3. The lines 203 indicate the dependence (here taken for simplicity as linear) of the frequency of the Josephson plasma waves upon their in-plane wave vector, and the location 205 marks the operation point that has been selected by the applied current and field, $\omega_{THz}$ and $k_{//}=2\pi/a$. The shaded area 207 represents electromagnet waves that can travel in free space, the light cone. The large separation of the location 205 from the light cone 207 illustrates the mismatch in wavelengths described above. If a grating with period equal to the Josephson plasma wavelength is introduced, the plasma waves can undergo Bragg reflection upon which their wave vector changes by the grating vector, $2\pi/a$, as shown by the arrows 211 in FIG. 3. The metal grating 131 induces a strong periodic modulation of the dielectric constant at the surface which gives rise to Bragg reflection of the plasma waves. If the grating period is chosen equal to the plasma wavelength, then the initial large wave vector of the plasma wave (location 205) is transformed into a small wave vector 213 inside the light cone 207, and the plasma waves become radiative through the top surface 115.

As a result, the large wave vector 205 is transferred to the small wave vector 213, well within the light cone 207, corresponding to a THz-wave with essentially zero in-plane wave vector. This wave is transferred through the grating into THz-radiation as indicated by the arrows 135 in FIGS. 2A and 2B, leading to top surface emission as opposed to highly undesirable, conventional edge emission from the sides of the device 100 (see FIG. 1). In one embodiment, an enhancement by more than a factor of $10^3$ in active surface area is achieved as compared to the end-fire configuration of the prior art.

Another aspect of the invention relates to tunability, that is, change in frequency of the emitted THz-radiation. For the stack 101 containing N superconducting layers, the frequency-wave vector relation is not a simple line (as indicated in FIG. 3), but consists of N closely spaced branches, which form a quasi-continuous band of frequencies. The width of this band determines the range over which the frequency of the THz-radiation can be tuned.

Another aspect of the present invention involves THz beam steering. If the grating period is slightly different from the vortex spacing, then the small wave vector 213 in FIG. 3 will not be located exactly at zero; instead the THz plasma wave maintains a small in-plane wave vector $k_{//}$. The emitted THz radiation has the same in-plane wave vector and is emitted at an angle $\alpha$ with respect to the normal given by $\sin(\alpha)=c\kappa_{//}/\omega_{THz}$. Therefore, by superimposing a small additional magnetic field onto the applied magnetic field 107, the vortex spacing; and thus the position of the small wave vector and large wave vector in FIG. 3 can be modulated. Consequently, the resulting $k_{//}$ vector and the beam direction can be controlled. With a superimposed ac-field the beam could be scanned back and forth for use in THz imaging applications, for example, for the stand-off chemical detection.

In one exemplary embodiment, the superconducting stack 101 comprises between about seventy and one hundred separate superconducting layers. In an exemplary embodiment, a dielectric material is provided in communication with the grating 131.

Extensive numerical simulations of the distribution of supercurrents and electromagnetic fields in Josephson-coupled superconducting stacks show large power densities of THz-waves. For example, for the preferred embodiment shown in FIG. 2A, a power density has been obtained of 797 W/cm² at a frequency of 3.7 THz residing at the top surface, which translates into an emitted radiation power of 0.12 mW for the device 100.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of producing efficient emission of terahertz electromagnetic radiation, comprising the steps of:
providing a tunable terahertz device, comprising a high temperature superconductor stack having a top surface; a first metallic conducting layer comprised of a grating patterned disposed on top of the high temperature superconductor stack and a second metallic conducting layer coupled electrically to a bottom of the superconducting stack;
applying a magnetic field to the device; and
outputting terahertz radiation through the top surface of the metallic conducting patterned grating layer.

2. The method as defined in claim 1 wherein the step of applying a magnetic field comprises forming Josephson vortices and generating a current flow perpendicular to the top surface of the superconductor stack.

3. The method as defined in claim 1 further including the step of tuning frequency of electromagnetic waves arising from motion of the Josephson vortices.

4. The method as defined in claim 3 wherein the step of tuning of frequency is accomplished by adjusting current applied to the device.

5. The method as defined in claim 2 wherein wavelength and frequency of the Josephson vortices is tuned to coincide with a Josephson plasma wave of the device, thereby pumping energy from the Josephson vortices into the Josephson plasma wave.

6. The method as defined in claim 3 wherein the Josephson plasma wave undergoes a Bragg reflection step and thereby controlling propagation of the electromagnetic waves.

7. The method as defined in claim 6 wherein the propagation of the electromagnetic waves is directed to security inspection of materials.

8. The method as defined in claim 1 wherein the high temperature superconductor stack comprises a $CuO_2$ based superconductor.

9. The method as defined in claim 8 wherein the $C_uO_2$ based superconductor consists essentially of $Bi_2Sr_2CaCu_2O_8$.

10. The method as defined in claim 1 wherein the grating has a period designed such that Bragg reflection of Josephson plasma waves occurs.

11. The method as defined in claim 1 further including the step of steering the terahertz radiation by tuning Josephson vortex spacing around a grating period of the grating.

12. The method as defined in claim 11 wherein the step of tuning the Josephson vortex spacing comprises applying an additional magnetic field onto the magnetic field applied to the tunable terahertz device.

13. The method as defined in claim 1 wherein the terahertz radiation is selected from a range of 0.3 to 20 THz in accordance with spectral specificity to vibrational and rotational modes of species selected from the group of chemical species and biomolecular species for an area of application.

14. A method of producing efficient emission of terahertz electromagnetic radiation, comprising the steps of:
providing a tunable terahertz device, comprising a high temperature superconductor stack having a top surface; a first metallic conducting layer comprised of a patterned grating disposed on top of the high temperature superconductor stack and a second metallic conducting layer disposed on a bottom of the high temperature superconductor stack and the high temperature superconductor stack comprised of a plurality of superconductor layers each being separated by an insulating layer;
applying a magnetic field to the device; and
outputting terahertz radiation through a top surface of the metallic conducting patterned grating layer.

15. The method as defined in claim 14 wherein the step of applying a magnetic field comprises forming Josephson vortices and generating a current flow perpendicular to the top surface of the plurality of superconductor layers.

16. The method as defined in claim 14 further including the step of tuning frequency of electromagnetic waves arising from motion of the Josephson vortices.

17. The method as defined in claim 16 wherein the step of tuning of frequency is accomplished by adjusting current applied to the device.

18. The method as defined in claim 15 wherein wavelength and frequency of the Josephson vortices is tuned to coincide with a Josephson plasma wave of the device, thereby pumping energy from the Josephson vortices into the Josephson plasma wave.

19. The method as defined in claim 16 wherein the Josephson plasma wave undergoes a Bragg reflection step and thereby controlling propagation of the electromagnetic waves.

20. The method as defined in claim 19 wherein the propagation of the electromagnetic waves is directed to security inspection of materials.

* * * * *